(12) United States Patent
Matsuoka et al.

(10) Patent No.: US 6,888,258 B2
(45) Date of Patent: May 3, 2005

(54) SEMICONDUCTOR DEVICE INCLUDING COPPER INTERCONNECT LINE AND BONDING PAD, AND METHOD OF MANUFACTURING THE SAME

(75) Inventors: Takeru Matsuoka, Tokyo (JP); Noriaki Fujiki, Tokyo (JP); Hiroki Takewaka, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/603,811

(22) Filed: Jun. 26, 2003

(65) Prior Publication Data

US 2004/0183197 A1 Sep. 23, 2004

(30) Foreign Application Priority Data

Jan. 9, 2003 (JP) .......................... 2003-002946

(51) Int. Cl.[7] .......................... H01L 23/48; H01L 23/52; H01L 29/40
(52) U.S. Cl. .................. 257/784; 257/765; 257/762; 438/687; 438/688; 438/652
(58) Field of Search .................. 257/762, 784, 257/763, 764, 765, 771, 622; 438/626, 627, 629, 643, 645, 653, 648, 687, 688, 652

(56) References Cited

U.S. PATENT DOCUMENTS

| 6,160,315 | A | * | 12/2000 | Chiang et al. | 257/762 |
| 6,417,575 | B2 | * | 7/2002 | Harada et al. | 257/784 |
| 6,559,545 | B2 | * | 5/2003 | Morozumi | 257/758 |
| 6,560,862 | B1 | * | 5/2003 | Chen et al. | 29/843 |
| 6,569,767 | B1 | * | 5/2003 | Fujisawa et al. | 438/687 |
| 6,610,596 | B1 | * | 8/2003 | Lee et al. | 438/653 |

FOREIGN PATENT DOCUMENTS

| EP | 1 119 046 | 7/2001 |
| JP | 1-268152 | 10/1989 |
| JP | 2-123740 | 5/1990 |
| JP | 10-340920 | 12/1998 |
| JP | 11-135506 | 5/1999 |
| JP | 2001-244268 | 9/2001 |

* cited by examiner

*Primary Examiner*—S. V. Clark
(74) *Attorney, Agent, or Firm*—Oblon, Spivak, McClelland, Maier & Neustadt, P.C.

(57) ABSTRACT

A contact and a copper interconnect line as an uppermost interconnect layer are buried in an interlayer insulating film. A pad area including aluminum alloy (such as AlCu or AlSiCu) is buried in a predetermined area of the copper interconnect line. A gold wire is bonded to the pad area.

12 Claims, 12 Drawing Sheets

SEMICONDUCTOR DEVICE INCLUDING COPPER INTERCONNECT LINE AND BONDING PAD, AND METHOD OF MANUFACTURING THE SAME

BACKGROUND OF THE INVENTION

1. Field of the Invention

The present invention relates to a technique of manufacturing a semiconductor device. More particularly, it relates to a semiconductor device including a copper interconnect line, and method of manufacturing the same.

2. Description of the Background Art

In an uppermost interconnect layer of a semiconductor device, a pad (bonding pad) is generally provided to be bonded to a wire which connects a lead of a package for holding the semiconductor device and the uppermost interconnect layer, for example. As an example, gold is a common material for a wire.

Resulting from a growing trend in recent years toward shrinkage and higher integration of a structure of a semiconductor device, and toward speedup of operations thereof, importance of reduction in interconnect resistance has been increasing. In response, instead of aluminum conventionally used, copper has been widely employed as a metal interconnect material.

However, copper has poorer adhesion to gold than aluminum. Resulting from the use of copper to form an interconnect line, a pad may also be formed from copper. In this case, poor adhesion between the resultant pad and a gold wire results in the problem that the wire bonded to the pad is likely to fall off, causing deterioration in reliability of operations of the semiconductor device or reduction in yield.

In response, in a semiconductor device using a copper interconnect line, an aluminum pad area may be provided on a surface of the copper interconnect line, the exemplary structure of which is introduced in Japanese Patent Application Laid-Open No. 2-123740 (1990) (pp. 3–5 and FIGS. 1–3), in Japanese Patent Application Laid-Open No. 11-135506 (1999) (pp. 3–4 and FIGS. 1–4), or in Japanese Patent Application Laid-Open No. 10-340920 (1998) (pp. 3–6 and FIGS. 1–4). In this structure, the pad area to which a wire is to be bonded includes aluminum. Therefore, while allowing reduction in interconnect resistance by the use of copper therefor, good adhesion between the pad area and the wire is obtained.

In the semiconductor device disclosed in Japanese Patent Application Laid-Open Nos. 2-123740 (1990), 11-135506 (1999) or 10-340920 (1998), an aluminum pad area is provided on a surface of a copper interconnect line. Therefore, in a structure including the pad area and the copper interconnect line, mechanical strength may be weakened.

A method of manufacturing a semiconductor device having a copper interconnect line generally employs a damascene process. For example, a copper interconnect line is formed by the damascene process, and thereafter, an aluminum pad area is provided thereon, as disclosed in Japanese Patent Application Laid-Open Nos. 11-135506 (1999) and 10-340920 (1998). This method requires respective steps to form the interconnect line and the pad area, causing complication of manufacturing steps and increase in number thereof.

In a wire bonding step generally employed, pressing a wire against a pad area on a semiconductor device with a tip of a bonding tool such as a wedge tool or a capillary tool, heat and/or ultrasonics is applied to bond the wire to the pad area. Accordingly, when an aluminum pad area is provided in the upper layer and a copper interconnect line is provided in the lower layer, stress exerted by this press may break through the upper aluminum layer, exposing the copper interconnect line thereunder. Copper is more likely to be oxidized than aluminum. As a result, if the copper interconnect line under the pad area is exposed to cause oxidation thereof, poor connection between the pad area and the wire is likely.

SUMMARY OF THE INVENTION

In a semiconductor device including a copper interconnect line, it is a first object of the present invention to improve adhesion between a pad area and a wire. A second object of the present invention is to suppress complication of manufacturing steps necessitated by formation of the pad area. It is a third object of the present invention to improve mechanical strength in the pad area. It is still a fourth object of the present invention to control exposure of the copper interconnect line caused by a wire bonding step.

According to a first aspect of the present invention, the semiconductor device includes a copper interconnect line and a pad area. The copper interconnect line is buried in an interlayer insulating film provided on a semiconductor substrate. The pad area is connected to the copper interconnect line. The pad area includes copper metal integrated with the copper interconnect line, and aluminum alloy at least partially buried in the copper metal.

According to a second aspect of the present invention, the semiconductor device includes a copper interconnect line and a pad area. The copper interconnect line is buried in an interlayer insulating film provided on a semiconductor substrate. The pad area is connected to the copper interconnect line. The pad area includes copper metal integrated with the copper interconnect line, and aluminum alloy. The aluminum alloy contacts the copper metal, and is at least partially buried in the interlayer insulating film.

Good adhesion is obtained between the wire and the pad area, and mechanical strength is improved in the pad area. Further, as there is no copper interconnect line under the pad area, exposure of the copper interconnect line is controlled caused by the wire bonding step.

According to a third aspect of the present invention, a method of manufacturing the semiconductor device includes the following steps (a) through (d). In the step (a), a trench is defined in an interlayer insulating film provided on a semiconductor substrate to form an interconnect line and a pad area. In the step (b), copper is deposited over the semiconductor substrate to the extent that the trench to form the pad area is not totally filled. The step (c) is performed after the step (b). In the step (c), aluminum alloy is deposited over the semiconductor substrate, to completely fill the trench to form the pad area. In the step (d), the copper and the aluminum alloy are removed while keeping the copper and the aluminum alloy in the trench to remain, to form the interconnect line and the pad area in the trench.

According to a fourth aspect of the present invention, the method of manufacturing the semiconductor device includes the following steps (a) through (d). In the step (a), a copper interconnect line is formed by a damascene process to be buried in an interlayer insulating film provided on a semiconductor substrate. In the step (b), an opening is defined in the interlayer insulating film in such a manner that the opening is in contact with the buried interconnect line. In the step (c), aluminum alloy is deposited to completely fill the opening. In the step (d), the aluminum alloy is removed while keeping the aluminum alloy at least in the opening to remain, to form a pad area including the aluminum alloy.

Increase in number of the manufacturing steps, necessitated by formation of the aluminum pad area, is suppressed to the minimum possible degree, thereby contributing to simplification of the manufacturing steps.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
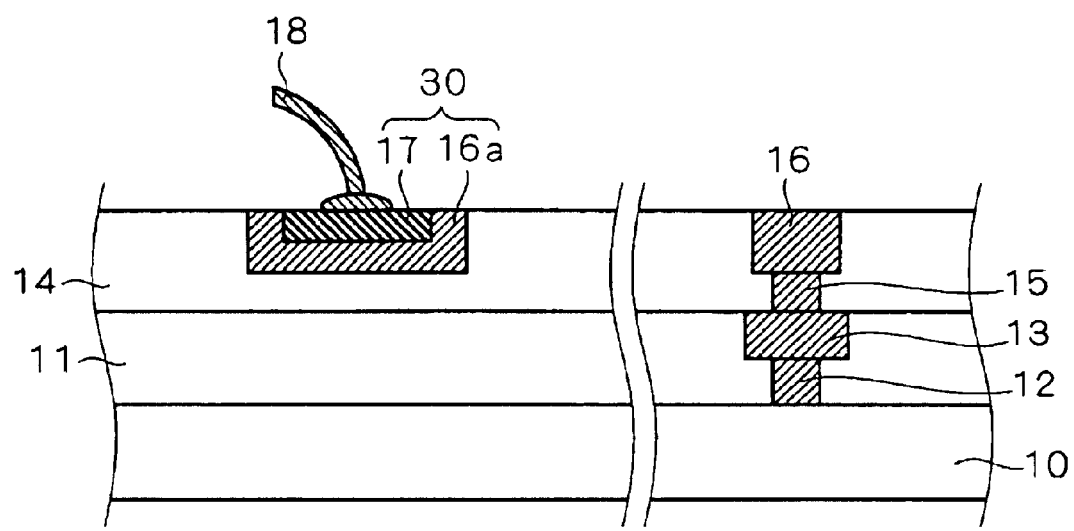
FIG. 1 illustrates a structure of a semiconductor device according to a first preferred embodiment of the present invention.

FIG. 1 illustrates a structure of a semiconductor device according to the first preferred embodiment of the present invention. As shown in FIG. 1, copper interconnection has a two-layer structure in a vertical direction, of which a copper interconnect line in the upper layer (namely, in the uppermost layer) includes a bonding pad formed therein.

As shown in FIG. 1, the semiconductor device comprises a silicon substrate 10, and a first interlayer insulating film 11 and a second interlayer insulating film 14 stacked in this order on the silicon substrate 10. The first interlayer insulating film 11 includes a first contact 12 and a first copper interconnect line 13 buried therein. The second interlayer insulating film 14 includes a second contact 15 and a second copper interconnect line 16 buried therein. As shown in the left side of FIG. 1, a bonding pad area 30 (hereinafter referred to as a "pad area 30") to be bonded to a gold wire 18 is formed in a predetermined area of the second copper interconnect line 16 as the uppermost interconnect layer. The pad area 30 has a copper metal area 16a as an integral area with the second copper interconnect line 16, and an aluminum alloy area 17 (including AlCu or AlSiCu, for example) buried in the copper metal area 16a.

As seen from FIG. 1, the wire 18 is bonded to the aluminum alloy area 17 of the pad area 30. Therefore, good adhesion is obtained between the wire 18 and the pad area 30. Further, the pad area 30 has the copper metal area 16a and the aluminum alloy area 17 buried therein. As compared with the conventional two-layer structure of copper and aluminum, mechanical strength is improved accordingly.

FIGS. 2 through 5 illustrate steps of manufacturing the semiconductor device according to the first preferred embodiment. With reference to FIGS. 2 through 5, a method of manufacturing the semiconductor device of the first preferred embodiment will be described. First, following a conventional process such as damascene, the first interlayer insulating film 11, the first contact 12, the first copper interconnect line 13, the second interlayer insulating film 14, and the second contact 15 are provided on the silicon substrate 10.

Figure 2:
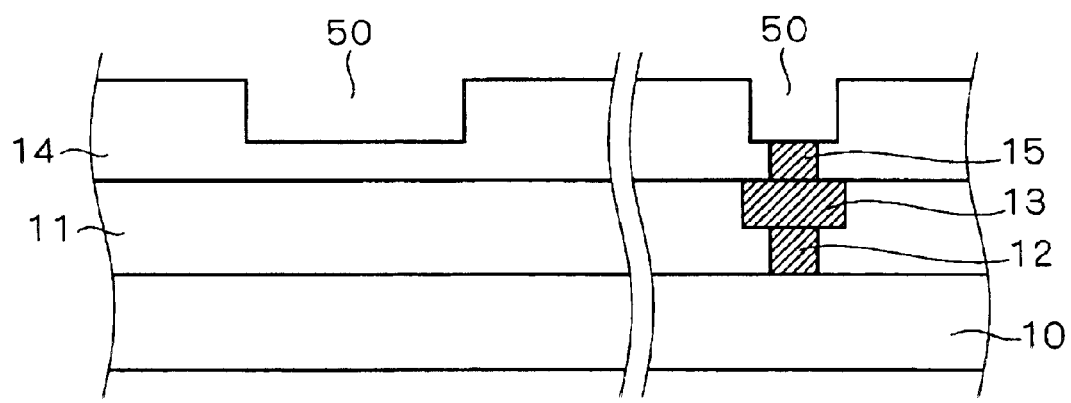
FIGS. 2 through 5 illustrate steps of manufacturing the semiconductor device according to the first preferred embodiment of the present invention.

Next, a trench 50 to form the second copper interconnect line 16 and the pad area 30 is defined by photolithography and etching in the second interlayer insulating film 14 as shown in FIG. 2. At this time, the trench 50 on the left side to form the pad area 30 should be greater in width than the trench 50 on the right side to form an interconnect line.

Figure 3:
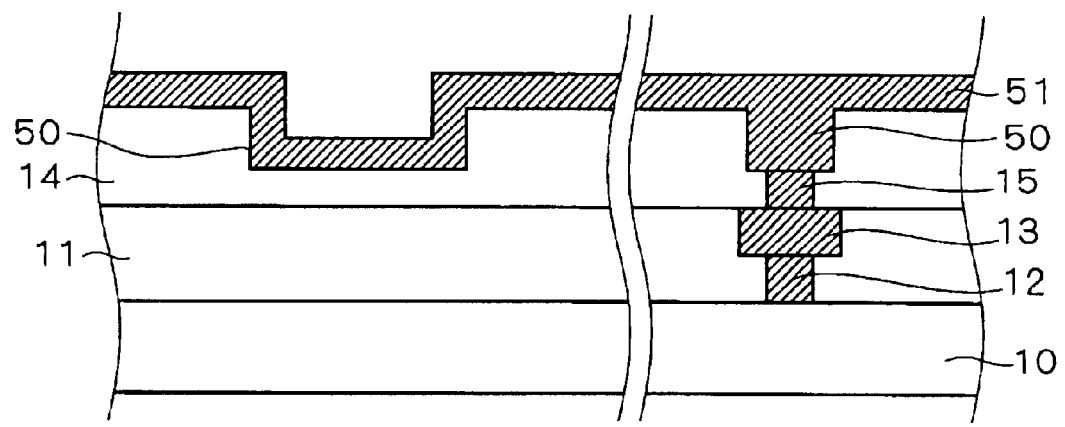

Next, using sputtering, plating or CVD (chemical vapor deposition), for example, copper 51 as a material for the second copper interconnect line 16 is deposited on the second interlayer insulating film 14 as shown in FIG. 3. At this time, the amount of the copper 51 to be deposited is so controlled that the trench 50 to form the pad area 30 is not totally filled with the copper 51. The trench 50 to form the interconnect line is smaller in width than the one for the pad area 30, and therefore, is completely filled with the copper 51.

Figure 4:
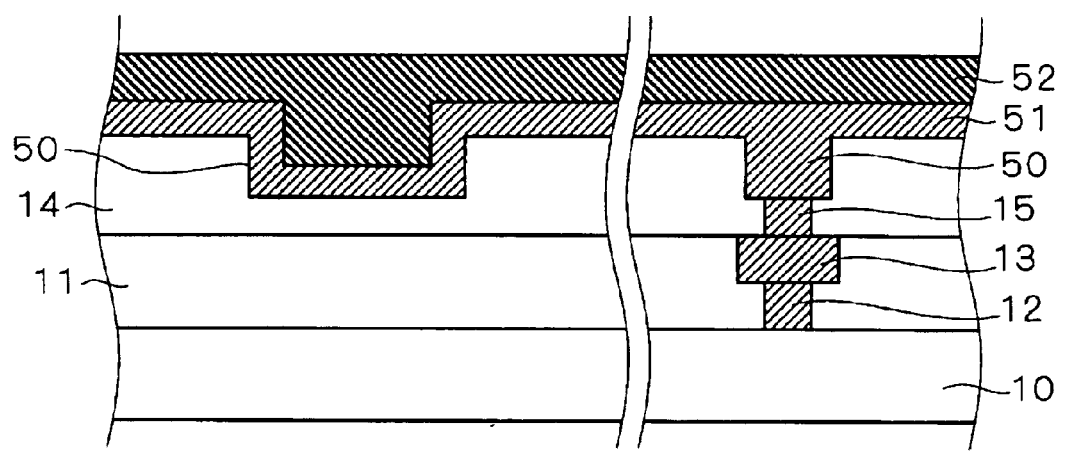

As shown in FIG. 4, aluminum alloy 52 as a material for the aluminum alloy area 17 is thereafter deposited on the copper 51 by sputtering or CVD, for example. As a result, the trench 50 is completely filled with the copper 51 and the aluminum alloy 52.

Figure 5:
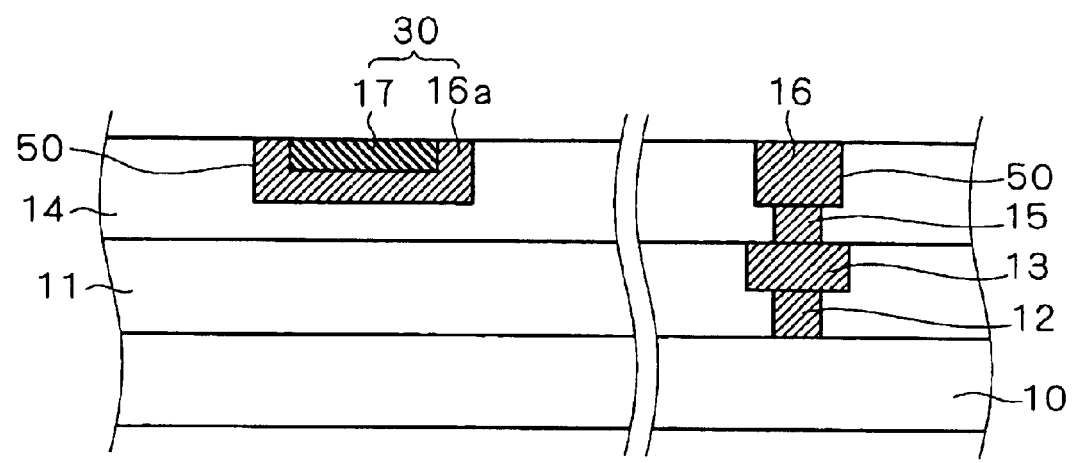

Next, following the process such as CMP (chemical mechanical polishing), excess copper 51 and excess aluminum alloy 52 are removed, while keeping the same in the trench 50 to remain. The resultant structure is as shown in FIG. 5, where the second copper interconnect line 16, and the pad area 30 including the copper metal area 16a and the aluminum alloy area 17, are simultaneously formed in the trench 50 defined in the second interlayer insulating film 14. As the second copper interconnect line 16 and the pad area 30 are simultaneously formed, formation of the aluminum alloy area 17 does not require a separate step. Therefore, increase in number of the manufacturing steps is suppressed, contributing to simplification of the manufacturing steps.

The trench 50 to form the interconnect line is completely filled only with the copper 51, and therefore, the aluminum alloy 52 deposited thereon is entirely removed. That is, the second copper interconnect line 16 on the right side of FIG. 5 only includes copper, and therefore, resistance is kept at a low level therein.

The final step is bonding of the wire 18 to the aluminum alloy area 17, to reach the structure of FIG. 1. Prior to this bonding step, a passivation film (not shown) may be provided on the second interlayer insulating film 14 to have an opening above the aluminum alloy area 17. In this case, unnecessary exposure of the second copper interconnect line 16 to the surface of the semiconductor device is avoided, whereby oxidation of the second copper interconnect line 16 is prevented.

As described so far, in the semiconductor device including the copper interconnect line according to the first preferred embodiment, good adhesion is obtained between the pad area 30 and the wire 18, and deterioration in mechanical strength in the pad area 30 is suppressed. Further, simplification of the manufacturing steps is allowed, thereby contributing to reduction in number of the manufacturing steps.

Second Preferred Embodiment

Figure 6:
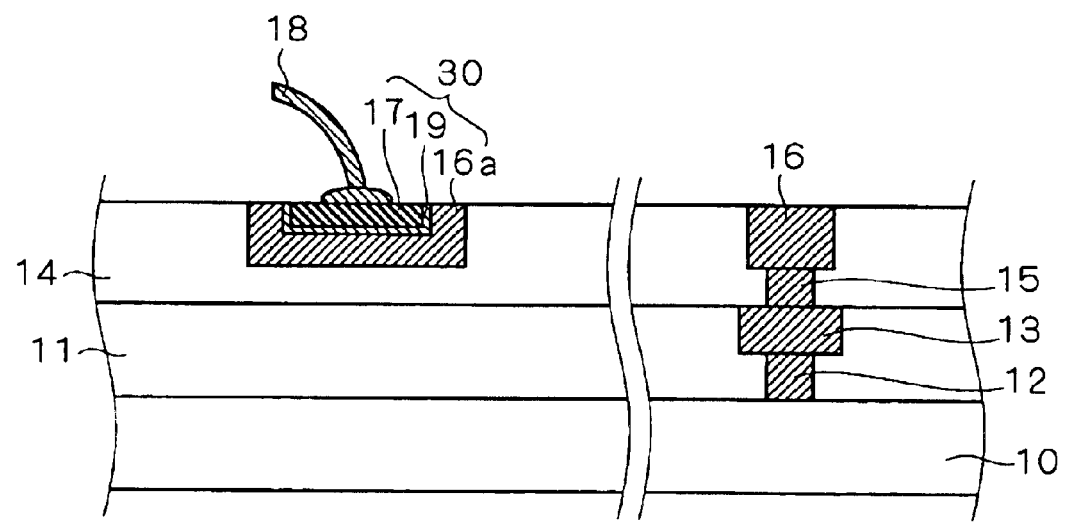
FIG. 6 illustrates a structure of a semiconductor device according to a second preferred embodiment of the present invention.

FIG. 6 illustrates a structure of a semiconductor device according to the second preferred embodiment of the present invention. In FIG. 6, the same functional constituents as those in FIG. 1 are designated by the same reference numerals, and the detailed description thereof will be omitted. As shown in FIG. 6, in the semiconductor device according to the second preferred embodiment, the aluminum alloy area 17 is provided with a titanium alloy layer 19 on the surface contacting the copper metal area 16a, namely, on the surface entering the copper metal area 16a. By way of example, the titanium alloy layer 19 may have a single-layer structure of a titanium film or a titanium nitride film, or alternatively, it may have a multilayer structure of a titanium film and a titanium nitride film.

As the titanium alloy layer 19 is interposed between the copper metal area 16a and the aluminum alloy area 17, mechanical strength is improved to a greater degree as compared with the first preferred embodiment. As an example, a crack in the second interlayer insulating film 14, which may be generated by stress exerted on the aluminum alloy area 17 in the wire bonding step, is unlikely. Similar to the first preferred embodiment, further, good adhesion is naturally obtained between the pad area 30 and the wire 18.

Next, a method of manufacturing the semiconductor device according to the second preferred embodiment will be described. First, following the same processes as employed in the first preferred embodiment, the first interlayer insulating film 11, the first contact 12, the first copper interconnect line 13, the second interlayer insulating film 14, and the second contact 15 are provided on the silicon substrate 10. Further, the trench 50 is defined in the second interlayer insulating film 14 to form the second copper interconnect line 16 and the pad area 30 (FIG. 2). Thereafter, the copper 51 as a material for the second copper interconnect line 16 is deposited on the second interlayer insulating film 14 (FIG. 3). At this time, the amount of the copper 51 to be deposited is so controlled that the trench 50 to form the pad area 30 is not totally filled with the copper 51.

Figure 7:
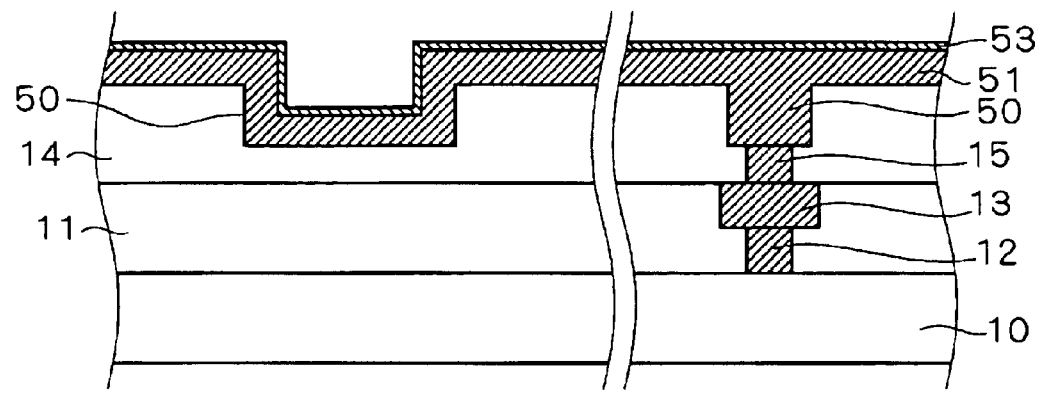
FIGS. 7 through 9 illustrate steps of manufacturing the semiconductor device according to the second preferred embodiment of the present invention.
Figure 8:
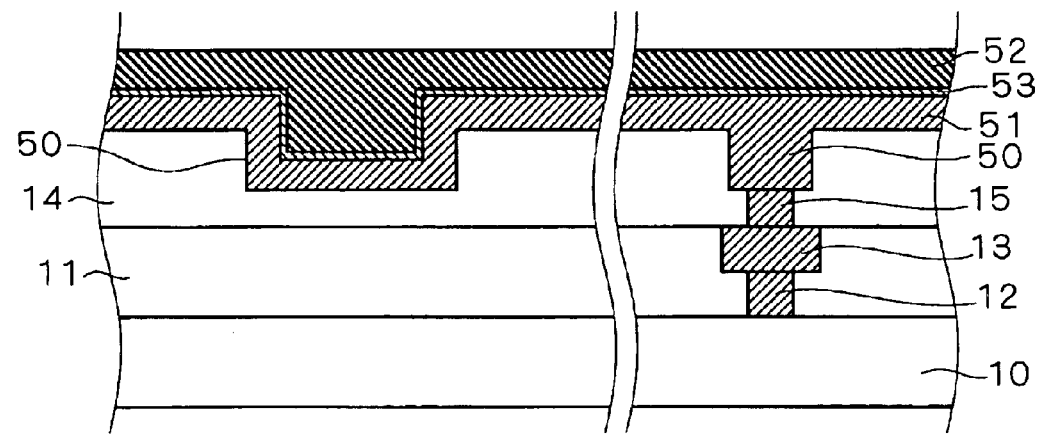

Next, using sputtering or CVD, for example, titanium alloy 53 is deposited on the copper 51 as shown in FIG. 7. At this time, the amount of the titanium alloy 53 to be deposited is also controlled so that the trench 50 to form the pad area 30 is not totally filled with the titanium alloy 53. As shown in FIG. 8, the aluminum alloy 52 as a material for the aluminum alloy area 17 is thereafter deposited by sputtering or CVD, for example, on the titanium alloy 53. As a result, the trench 50 is completely filled with the copper 51, the titanium alloy 53, and the aluminum alloy 52.

Figure 9:
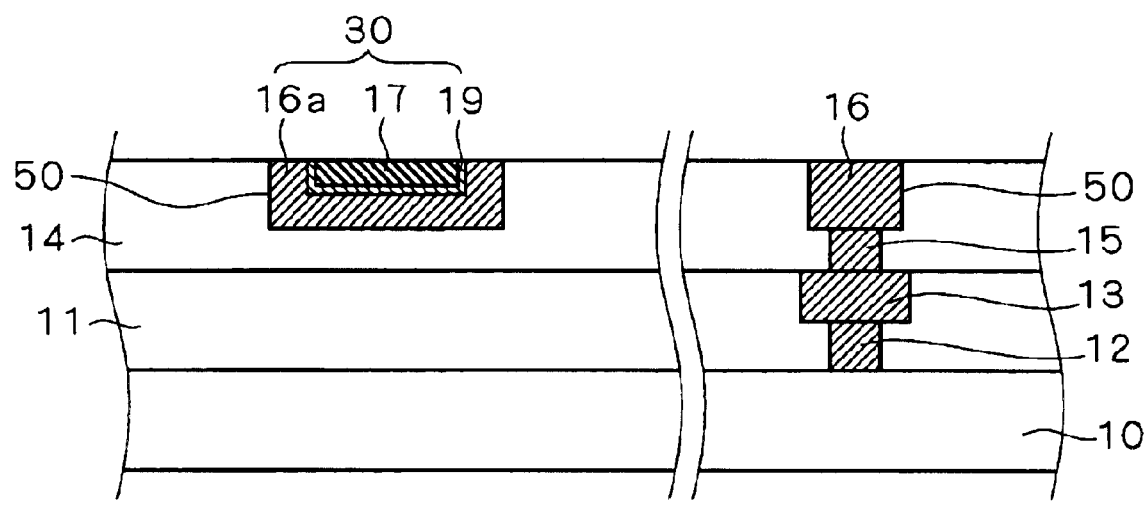

Subsequently, following the process such as CMP, excess copper 51, excess titanium alloy 53, and excess aluminum alloy 52 are removed, while keeping the same in the trench 50 to remain. The resultant structure is as shown in FIG. 9, where the second copper interconnect line 16, and the pad area 30 including the copper metal area 16a, the aluminum alloy area 17, and the titanium alloy layer 19, are simultaneously formed in the trench 50 defined in the second interlayer insulating film 14.

The final step is bonding of the wire 18 to the aluminum alloy area 17 of the pad area 30, to reach the structure of FIG. 6. Prior to this bonding step, a passivation film (not shown) may be provided on the second interlayer insulating film 14 to have an opening above the aluminum alloy area 17.

As compared with the manufacturing steps of the first preferred embodiment, only the step of depositing the titanium alloy 53 is added between the step of depositing the copper 51 and the step of depositing the aluminum alloy 52, without making significant modification to the first preferred embodiment. That is, increase in number of the manufacturing steps, necessitated by formation of the titanium alloy layer 19, can be suppressed to the minimum possible degree.

Third Preferred Embodiment

Figure 10:
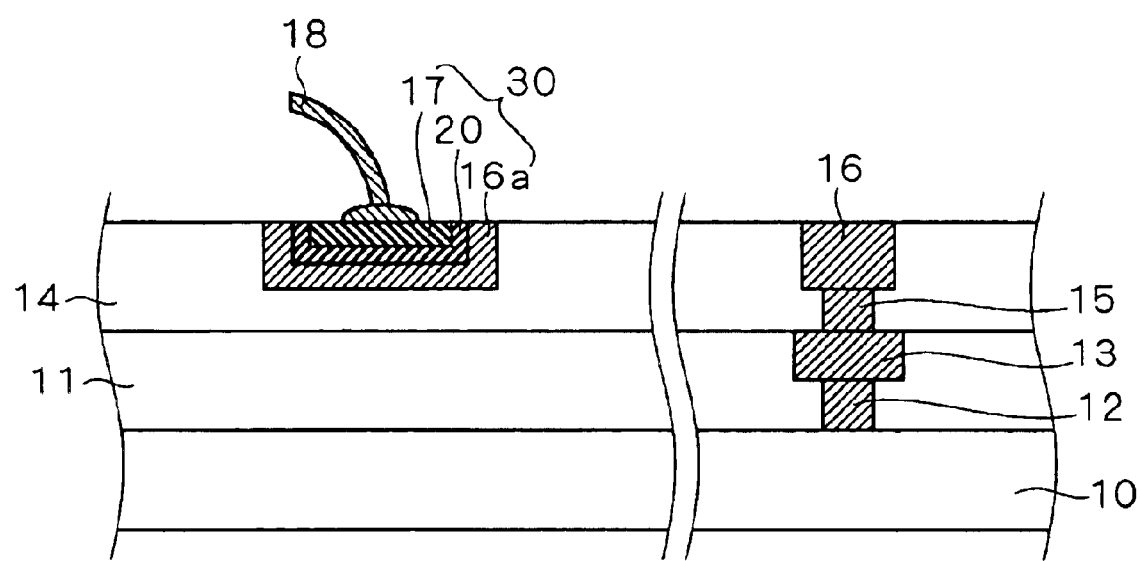
FIG. 10 illustrates a structure of a semiconductor device according to a third preferred embodiment of the present invention.

FIG. 10 illustrates a structure of a semiconductor device according to the third preferred embodiment of the present invention. In FIG. 10, the same functional constituents as those in FIG. 1 are designated by the same reference numerals. In the semiconductor device of the third preferred embodiment, the aluminum alloy area 17 is provided with a compound layer 20 including titanium alloy, copper and aluminum (hereinafter referred to as a "titanium compound layer 20") on the surface contacting the copper metal area 16a, namely, on the surface entering the copper metal area 16a.

It is generally known that titanium alloy including aluminum and copper has a greater strength than that of normal titanium alloy. In view of this, the structure including the titanium compound layer 20 interposed between the copper metal area 16a and the aluminum alloy area 17 provides improved mechanical strength as compared with the second preferred embodiment. Similar to the first preferred embodiment, good adhesion is naturally obtained between the pad area 30 and the wire 18.

Next, a method of manufacturing the semiconductor device according to the third preferred embodiment will be described. First, following the same processes as employed in the second preferred embodiment, the second contact 15, the second copper interconnect line 16 (copper metal area 16a), the aluminum alloy area 17, and the titanium alloy layer 19 are provided in the second interlayer insulating film 14 (FIG. 9).

Prior to wire bonding, thermal processing is thereafter performed in an atmosphere including inactive gas (such as $N_2$ or $H_2$), in a temperature range of 350° C. to 450° C., and for a duration of about 10 to 100 minutes, whereby the titanium alloy layer 19 reacts with copper and aluminum respectively contained in the copper metal area 16a and the aluminum alloy area 17 to form the titanium compound layer 20.

The final step is bonding of the wire 18 to the aluminum alloy area 17 of the pad area 30, to reach the structure of FIG. 10. Prior to this bonding step, a passivation film (not shown) may be provided on the second interlayer insulating film 14 to have an opening above the aluminum alloy area 17.

As compared with the manufacturing steps of the second preferred embodiment, only the step of thermal processing is additionally required, without making significant modification to the second preferred embodiment. That is, increase in number of the manufacturing steps, necessitated by formation of the titanium compound layer, 20 can be suppressed to the minimum possible degree.

Fourth Preferred Embodiment

Figure 11:
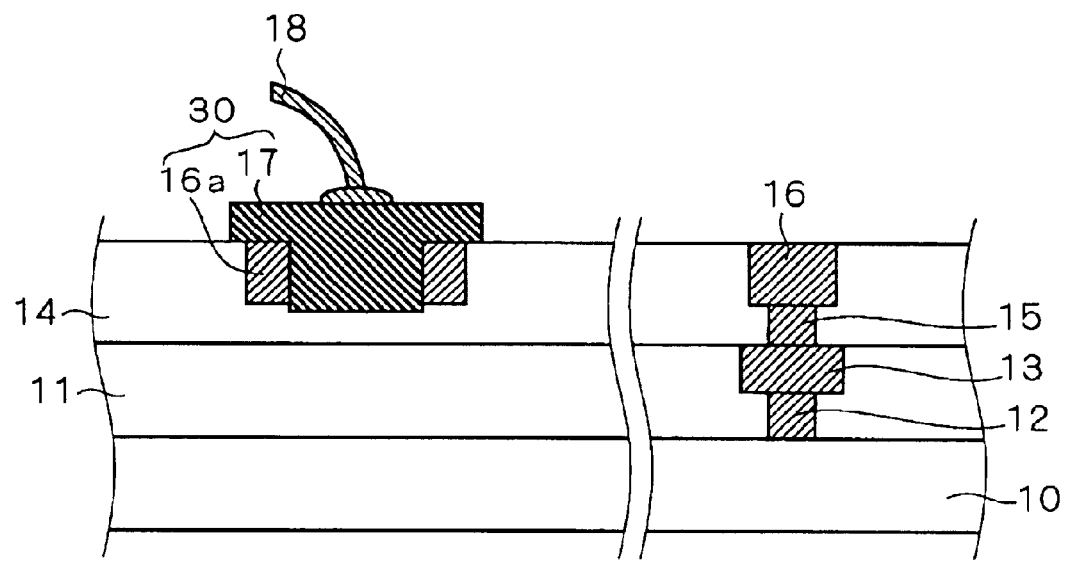
FIG. 11 illustrates a structure of a semiconductor device according to a fourth preferred embodiment of the present invention.

FIG. 11 illustrates a structure of a semiconductor device according to the fourth preferred embodiment of the present invention. In FIG. 11, the same functional constituents as those in FIG. 1 are designated by the same reference numerals. As shown in FIG. 11, in the semiconductor device according to the fourth preferred embodiment, the pad area 30 to be bonded to the gold wire 18 is formed in a predetermined area of the second copper interconnect line 16 as the uppermost interconnect layer. The pad area 30 has the copper metal area 16a as an integral area with the second copper interconnect line 16, and the aluminum alloy area 17 buried in the copper metal area 16a. A bottom surface of the aluminum alloy area 17 entering the copper metal area 16a reaches the second interlayer insulating film 14. That is, the second copper interconnect line 16 operative to constitute the pad area 30 (the copper metal area 16a) has an annular shape. The aluminum alloy area 17 is partially buried in this annulus.

As seen from FIG. 11, there is no copper interconnect line 16 (copper metal area 16a) under the aluminum alloy area 17 buried in the copper metal area 16a. Even when stress exerted in the wire bonding step breaks through the aluminum alloy area 17, no exposure of the second copper interconnect line 16 occurs accordingly at this breakage. Therefore, poor connection between the pad area 30 and the wire 18, resulting from oxidation of the second copper interconnect line 16, is unlikely. Further, the aluminum alloy area 17 is allowed to have a greater thickness than the one in the first preferred embodiment. Therefore, damage to the second interlayer insulating film 14 caused by the wire bonding step is controlled, whereby a crack in the second interlayer insulating film 14 is unlikely.

Figure 12:
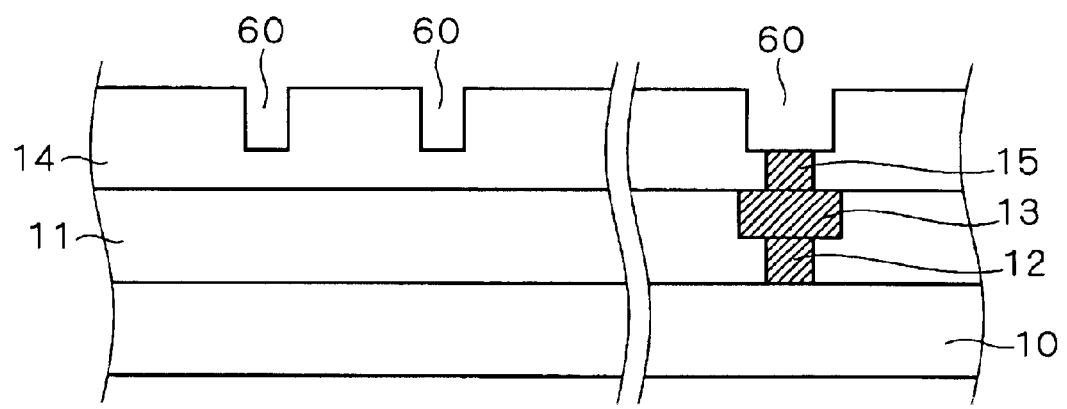
FIGS. 12 through 17 illustrate steps of manufacturing the semiconductor device according to the fourth preferred embodiment of the present invention.

Next, a method of manufacturing the semiconductor device according to the fourth preferred embodiment will be described. First, following a conventional process, the first interlayer insulating film 11, the first contact 12, the first copper interconnect line 13, the second interlayer insulating film 14, and the second contact 15 are provided on the silicon substrate 10. Next, a trench 60 to form the second copper interconnect line 16 and the pad area 30 is defined in the second interlayer insulating film 14 as shown in FIG. 12. At this time, the trench 60 to form the pad area 30 (on the left side of FIG. 12) should be defined into annular shape.

Figure 13:
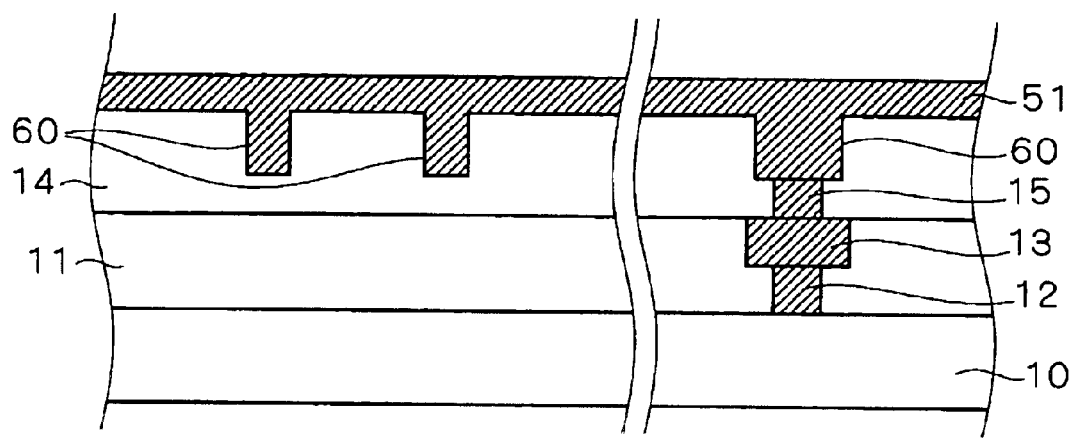
Figure 14:
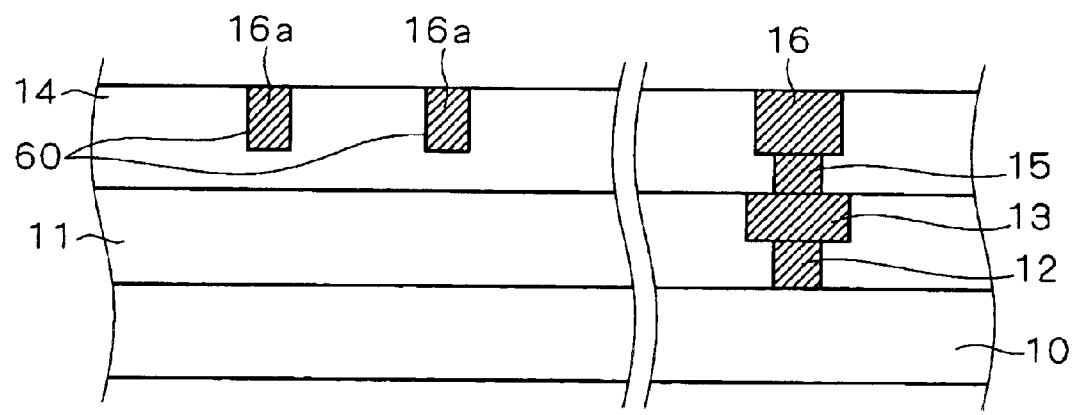

The copper 51 as a material for the second copper interconnect line 16 is thereafter deposited on the second interlayer insulating film 14 as shown in FIG. 13, whereby the trench 60 is completely filled with the copper 51. Subsequently, following the process such as CMP, excess copper 51 is removed, while keeping the same in the trench 60 to remain. The resultant structure is as shown in FIG. 14, where the second copper interconnect line 16 and the annular copper metal area 16a are simultaneously formed in the trench 60 defined in the second interlayer insulating film 14.

Figure 15:
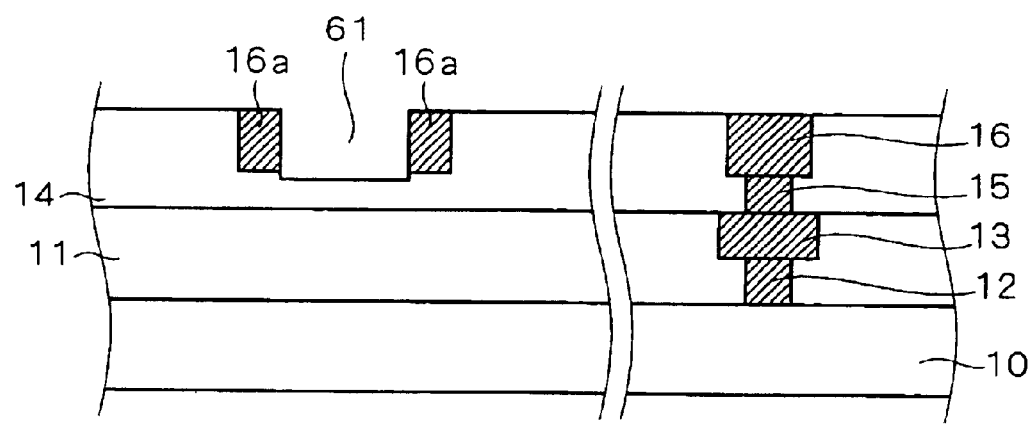
Figure 16:
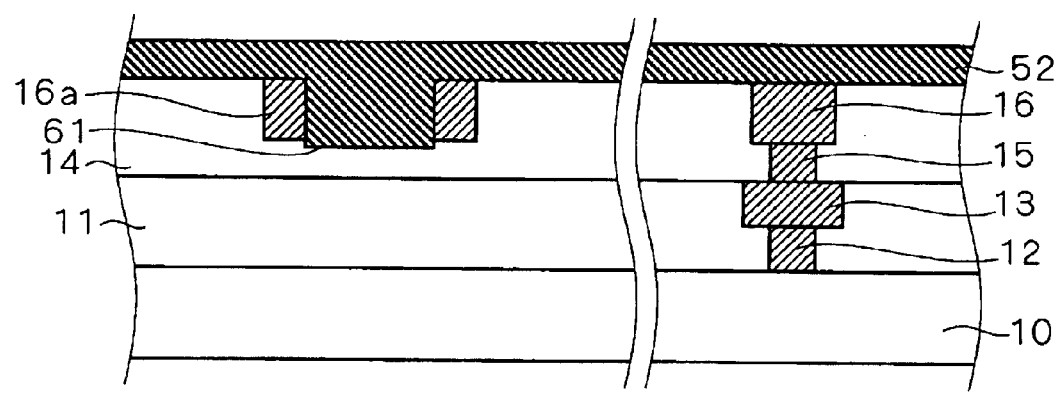

Next, as shown in FIG. 15, an opening 61 to form the aluminum alloy area 17 is defined by photolithography and etching in the second interlayer insulating film 14. More particularly, the opening 61 is formed inside the annulus defined by the copper metal area 16a, to be in contact with the copper metal area 16a. Thereafter as shown in FIG. 16, the aluminum alloy 52 is deposited on the second interlayer insulating film 14, whereby the opening 61 is filled with the aluminum alloy 52.

Figure 17:
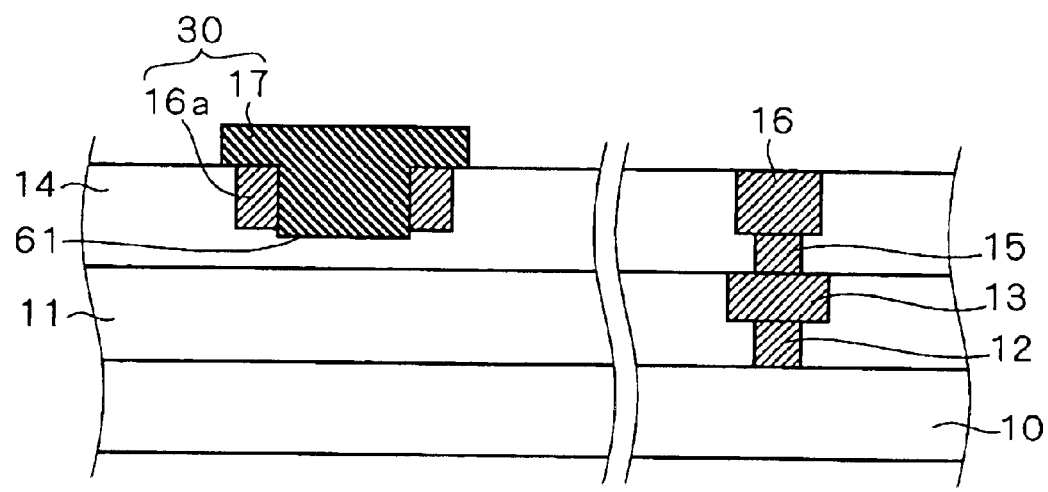

Then excess aluminum alloy 52 is removed by photolithography and etching, to form the aluminum alloy area 17 shown in FIG. 17.

The final step is bonding of the wire 18 to the aluminum alloy area 17 of the pad area 30, to reach the structure of FIG. 11. Prior to this bonding step, a passivation film (not shown) may be provided on the second interlayer insulating film 14 to have an opening above the aluminum alloy area 17.

Figure 18:
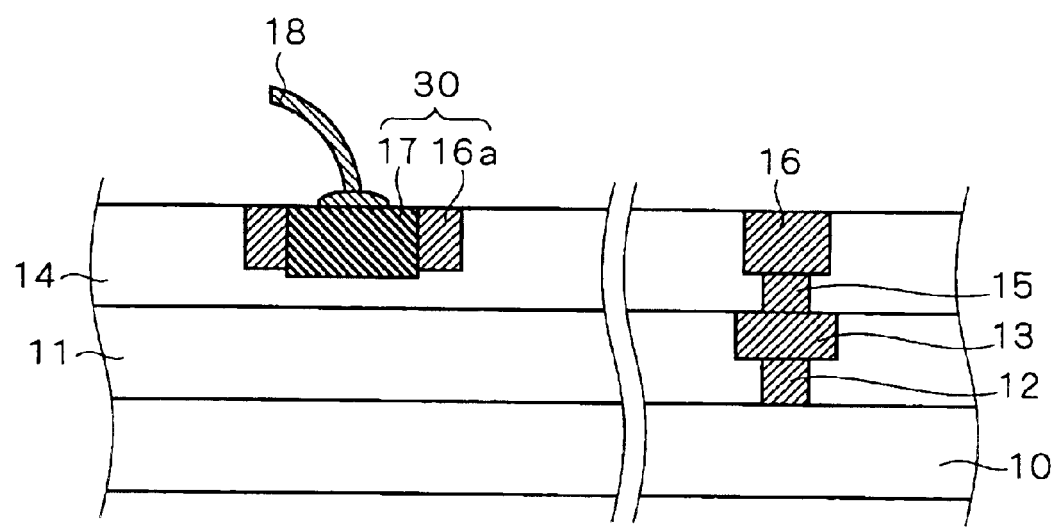
FIGS. 18 and 19 each illustrate a modification of the semiconductor device according to the fourth preferred embodiment of the present invention.

In the foregoing step, excess aluminum alloy 52 other than that for forming the aluminum alloy area 17 is removed by photolithography and etching. Alternative process such as CMP may be employed to remove the aluminum alloy 52, while keeping the same in the opening 61 to remain. The resultant structure is as shown in FIG. 18, where the aluminum alloy area 17 is entirely buried in the copper metal area 16a integral area with the second copper interconnect line 16, and in the second interlayer insulating film 14.

Figure 19:
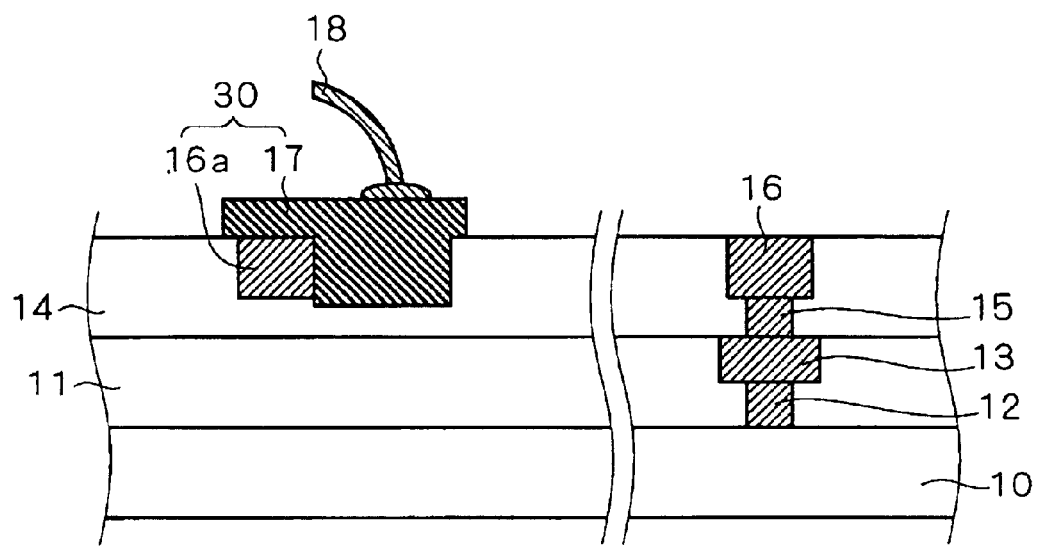

In the foregoing description, the aluminum alloy area 17 is partially buried inside the annulus defined by the copper metal area 16a operative to constitute the pad area 30. However, shapes of the second copper interconnect line 16 and the aluminum alloy area 17 are not limited to these. As long as the aluminum alloy area 17 is in touch with the copper metal area 16a, and no copper metal area 16a is defined under the aluminum alloy area 17, the aluminum alloy area 17 may be directly buried in the second interlayer insulating film 14. The exemplary structure of which is as shown in FIG. 19, where exposure of the second copper interconnect line 16, caused by the wire bonding step, is also prevented. On the other hand, when the aluminum alloy area 17 is provided to contact the inside of the copper metal area 16a operative to constitute the pad area 30, a large contact area is provided between the copper metal area 16a and the aluminum alloy area 17, resulting in suppression of contact resistance therebetween.

Fifth Preferred Embodiment

Figure 20:
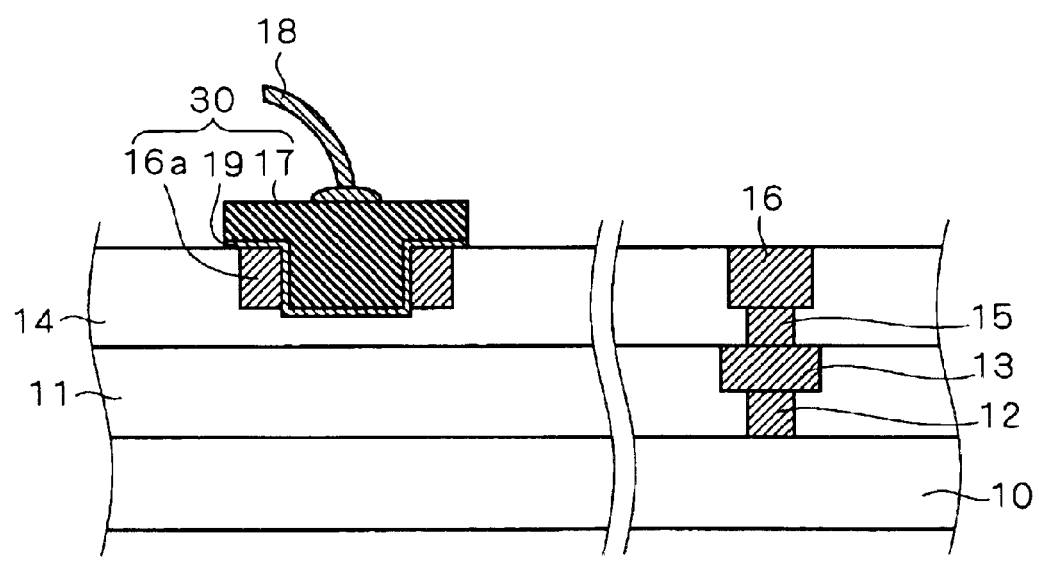
FIG. 20 illustrates a structure of a semiconductor device according to a fifth preferred embodiment of the present invention.
Figure 21:
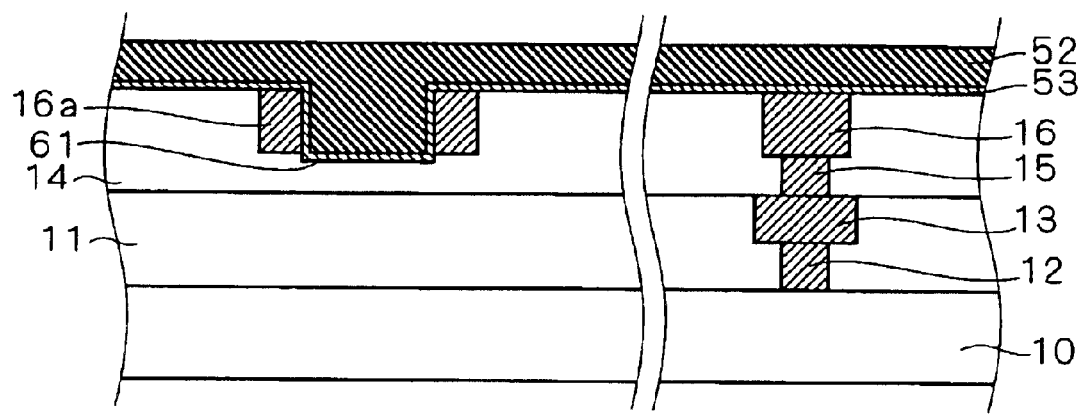
FIG. 21 illustrates a step of manufacturing the semiconductor device according to the fifth preferred embodiment of the present invention.

FIG. 20 illustrates a structure of a semiconductor device according to the fifth preferred embodiment of the present invention. In the semiconductor device of the fifth preferred embodiment, the aluminum alloy area 17 is provided with the titanium alloy layer 19 at least on the surface entering the copper metal area 16a. That is, the titanium alloy layer 19 is provided on a contact surface between the copper metal area 16a and the aluminum alloy area 17.

As the titanium alloy layer 19 is provided on the surface of the aluminum alloy area 17, mechanical strength is improved to a greater degree as compared with the fourth preferred embodiment. As an example, a crack in the second interlayer insulating film 14, which may be generated by stress exerted on the aluminum alloy area 17 in the wire bonding step, is unlikely. Similar to the fourth preferred embodiment, further, good adhesion is naturally obtained between the pad area 30 and the wire 18.

Next, a method of manufacturing the semiconductor device according to the fifth preferred embodiment will be described. First, following the same processes as employed in the fourth preferred embodiment, the first interlayer insulating film 11, the first contact 12, the first copper interconnect line 13, the second interlayer insulating film 14, the second contact 15, and the second copper interconnect line 16 (copper metal area 16a) are provided on the silicon substrate 10 (FIG. 14). Thereafter, the opening 61 is defined in the second interlayer insulating film 14 to form the aluminum alloy area 17 (FIG. 15). More particularly, the opening 61 is formed inside the annulus defined by the copper metal area 16a operative to constitute the pad area 30, to be in contact with the copper metal area 16a.

Next, using sputtering or CVD, the titanium alloy 53 is deposited on the second interlayer insulating film 14. At this time, the amount of the titanium alloy 53 to be deposited is so controlled that the opening 61 is not totally filled with the titanium alloy 53. The aluminum alloy 52 as a material for the aluminum alloy area 17 is subsequently deposited by sputtering or CVD on the titanium alloy 53. As a result, the opening 61 is completely filled with the titanium alloy 53 and the aluminum alloy 52. The next step is removal of excess aluminum alloy 52 and excess titanium alloy 53 using photolithography and etching, to form the aluminum alloy area 17 and the titanium alloy layer 19 shown in FIG. 20.

The final step is bonding of the wire 18 to the aluminum alloy area 17. Prior to this bonding step, a passivation film (not shown) may be provided on the second interlayer insulating film 14 to have an opening above the aluminum alloy area 17.

Figure 22:
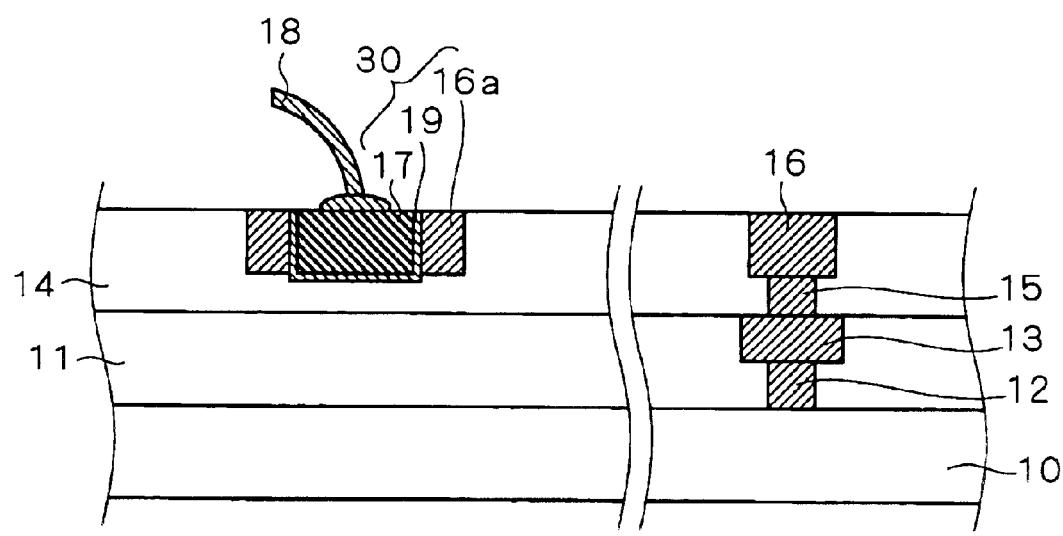
FIG. 22 illustrates a modification of the semiconductor device according to the fifth preferred embodiment of the present invention.

In the foregoing step, excess aluminum alloy 52 and excess titanium alloy 53 other than those for respectively forming the aluminum alloy area 17 and the titanium alloy layer 19 are removed by photolithography and etching. Alternative process such as CMP may be employed to remove the aluminum alloy 52 and the titanium alloy 53, while keeping the same in the opening 61 to remain. The resultant structure is as shown in FIG. 22, where the aluminum alloy area 17 is entirely buried in the copper metal area 16a and in the second interlayer insulating film 14.

In the fifth preferred embodiment, the aluminum alloy area 17 is also partially buried inside the annulus defined by the copper metal area 16a. However, shapes of the copper metal area 16a and the aluminum alloy area 17 are not limited to these. As long as the aluminum alloy area 17 is in touch with the copper metal area 16a, and no copper metal area 16a is defined under the aluminum alloy area 17, the aluminum alloy area 17 may be directly buried in the second interlayer insulating film 14. In this case, the titanium alloy layer 19 is formed on the surface of the aluminum alloy area 17 entering the second interlayer insulating film 14.

Sixth Preferred Embodiment

Figure 23:
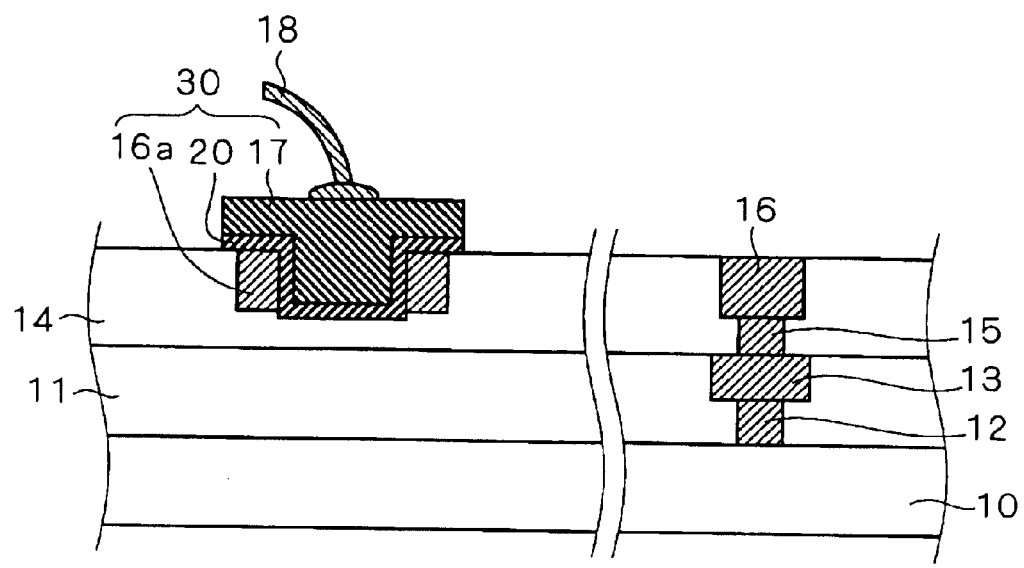
FIG. 23 illustrates a structure of a semiconductor device according to a sixth preferred embodiment of the present invention.

FIG. 23 illustrates a structure of a semiconductor device according to the sixth preferred embodiment of the present invention. In the semiconductor device of the sixth preferred embodiment, the aluminum alloy area 17 is provided with a compound layer including titanium alloy, copper and aluminum (titanium compound layer 20) at least on the surface entering the copper metal area 16a. That is, the titanium compound layer 20 is provided on the contact surface between the copper metal area 16a and the aluminum alloy area 17.

Accordingly, mechanical strength is improved to a greater degree as compared with the fifth preferred embodiment. Further, good adhesion is naturally obtained between the pad area 30 and the wire 18.

Next, a method of manufacturing the semiconductor device according to the sixth preferred embodiment will be described. First, following the same processes as employed in the fifth preferred embodiment, the second contact 15, the second copper interconnect line 16 (copper metal area 16a), the aluminum alloy area 17, and the titanium alloy layer 19 are provided in the second interlayer insulating film 14.

Prior to wire bonding, thermal processing is thereafter performed in an atmosphere including inactive gas (such as $N_2$ or $H_2$), in a temperature range of 350° C. to 450° C., and for a duration of about 10 to 100 minutes, whereby the titanium alloy layer 19 reacts with copper and aluminum respectively contained in the copper metal area 16a and the aluminum alloy area 17 to form the titanium compound layer 20.

The final step is bonding of the wire 18 to the aluminum alloy area 17. Prior to this bonding step, a passivation film (not shown) may be provided on the second interlayer insulating film 14 to have an opening above the aluminum alloy area 17.

Figure 24:
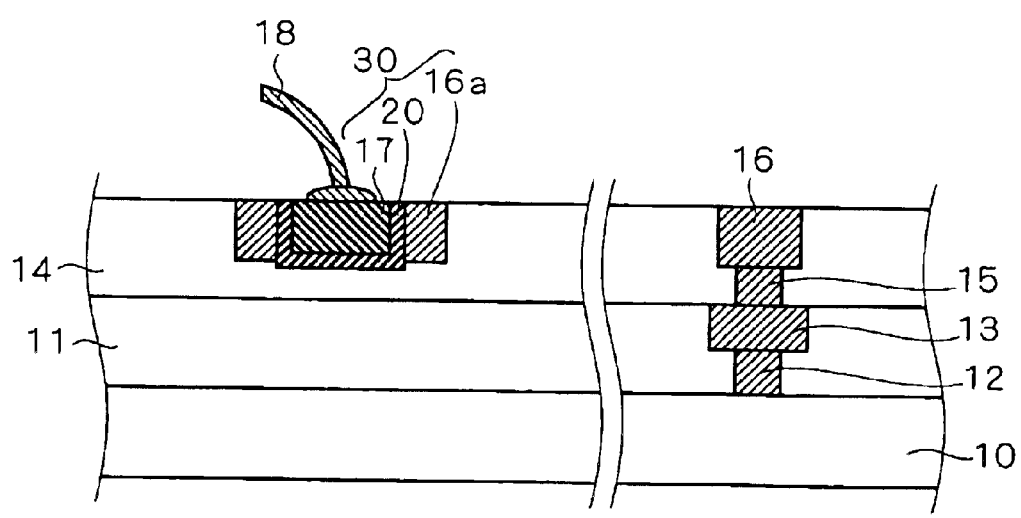
FIG. 24 illustrates a modification of the semiconductor device according to the sixth preferred embodiment of the present invention.

In the sixth preferred embodiment, excess aluminum alloy 52 and excess titanium alloy 53, other than those for respectively forming the aluminum alloy area 17 and the titanium alloy layer 19, may also be removed by CMP, for example. The resultant structure obtained by CMP is as shown in FIG. 24, where the aluminum alloy area 17 and the titanium compound layer 20 are entirely buried in the copper metal area 16a and in the second interlayer insulating film 14.

As long as the aluminum alloy area 17 is in touch with the copper metal area 16a, and no copper metal area 16a is defined under the aluminum alloy area 17, the aluminum alloy area 17 may be directly buried in the second interlayer insulating film 14. In this case, the titanium compound layer 20 is formed on the surface of the aluminum alloy area 17 entering the second interlayer insulating film 14.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:

a copper interconnect line buried in an interlayer insulating film provided on a semiconductor substrate; and a pad area connected to said copper interconnect line, wherein said pad area comprises:

copper metal integrated with said copper interconnect line; and aluminum alloy at least partially buried in said copper metal and a bottom surface thereof contacts said interlayer insulating film through said copper metal.

2. The semiconductor device according to claim 1, wherein said aluminum alloy is entirely buried in said copper metal.

3. The semiconductor device according to claim 1, wherein said pad area comprises a titanium alloy layer provided at least on a surface of said aluminum alloy buried in said copper metal.

4. A semiconductor device, comprising:

a copper interconnect line buried in an interlayer insulating film provided on a semiconductor substrate; and a pad area connected to said copper interconnect line, wherein said pad area comprises:

copper metal integrated with said copper interconnect line, aluminum alloy at least partially buried in said copper metal, and a compound layer provided at least on a surface of said aluminum alloy buried in said copper metal, said compound layer including titanium alloy, copper and aluminum.

5. A semiconductor device, comprising:

a copper interconnect line buried in an interlayer insulating film provided on a semiconductor substrate; and a pad area connected to said copper interconnect line, wherein said pad area comprises:

copper metal integrated with said copper interconnect line; and aluminum alloy contacting said copper metal, said aluminum alloy being at least partially buried not in said copper metal but in said interlayer insulating film.

6. The semiconductor device according to claim 5, wherein said pad area comprises a titanium alloy layer provided at least on a surface of said aluminum alloy buried in said interlayer insulating film.

7. The semiconductor device according to claim 5, wherein said pad area comprises a compound layer provided at least on a surface of said aluminum alloy buried in said interlayer insulating film, said compound layer including titanium alloy, copper and aluminum.

8. A method of manufacturing a semiconductor device, comprising the steps of:

(a) defining a trench in an interlayer insulating film to form an interconnect line and a pad area, said interlayer insulating film being provided on a semiconductor substrate;

(b) depositing copper over said semiconductor substrate to the extent that said trench to form said pad area is not totally filled;

(c) after said step (b), depositing titanium alloy over said semiconductor substrate to the extent that said trench to form said pad area is not totally filled;

(d) after said step (c), depositing aluminum alloy over said semiconductor substrate, to completely fill said trench to form said pad area;

(e) performing thermal processing to cause reaction between said titanium alloy, said copper and said aluminum alloy; and (f) removing said copper, said titanium alloy and said aluminum alloy while keeping said copper, said titanium alloy and said aluminum alloy in said trench to remain, to form said interconnect line and said pad area in said trench.

9. A method of manufacturing a semiconductor device, comprising the steps of:

(a) forming a copper interconnect line by a damascene process to be buried in an interlayer insulating film provided on a semiconductor substrate;

(b) after said step (a), defining an opening in said interlayer insulating film in such a manner that said opening is in contact with said buried interconnect line;

(c) depositing aluminum alloy to completely fill said opening; and (d) removing said aluminum alloy while keeping said aluminum alloy at least in said opening to remain, to form a pad area including said aluminum alloy.

10. The method according to claim 9, wherein said buried interconnect line formed in said step (a) has an annular shape surrounding said opening defined in said step (b).

11. The method according to claim 9, further comprising the step of:

(e) between said steps (b) and (c), depositing titanium alloy over said semiconductor substrate to the extent that said opening is not completely filled, wherein said step (d) further removes said titanium alloy while keeping said titanium alloy in said opening to remain.

12. The method according to claim 11, further comprising the step of:

(f) after said step (e), performing thermal processing to cause reaction between said titanium alloy, said copper and said aluminum alloy.

* * * * *